United States Patent [19]

Haruta et al.

[11] Patent Number: 5,537,050
[45] Date of Patent: Jul. 16, 1996

[54] PROCESS FOR INSPECTING ELECTRODES USING ROTATION ALIGNMENT CORRECTION

[75] Inventors: Yuichi Haruta; Kentaroo Sugawara, both of Yokohama; Keikichi Yagii, Tama, all of Japan

[73] Assignee: Japan Synthetic Rubber Co., Ltd., Tokyo, Japan

[21] Appl. No.: 202,589

[22] Filed: Feb. 28, 1994

[30] Foreign Application Priority Data

Mar. 2, 1993 [JP] Japan ................................ 5-064790

[51] Int. Cl.$^6$ .............................. G01R 1/04; G01R 1/073
[52] U.S. Cl. .............................. 324/757; 356/401; 348/87
[58] Field of Search ................................ 324/756–762; 356/401–412; 358/101; 364/589

[56] References Cited

U.S. PATENT DOCUMENTS

| | | | |
|---|---|---|---|
| 4,929,893 | 5/1990 | Sato et al. | 324/758 |
| 4,943,767 | 7/1990 | Yokota | 324/158 P |
| 4,985,676 | 1/1991 | Karasawa | 324/758 |
| 5,274,575 | 12/1993 | Abe | 364/559 |
| 5,381,104 | 1/1995 | Kimura et al. | 324/758 |

OTHER PUBLICATIONS

Printed Circuit World Convention VI; San Francisco, Ca USA; Yuichi Haruta, et al., "An Economic Analysis of Fixtured and Fixtureless Testing Techniques—A New Testing System for Bare Boards", pp. P5–1 to P5–4 and P5–i, May 11–14, 1993.

*Primary Examiner*—Kenneth A. Wieder
*Assistant Examiner*—Barry C. Bowser
*Attorney, Agent, or Firm*—Oblon, Spivak, McClelland, Maier & Neustadt

[57] ABSTRACT

A process for inspecting an electrode plate having plural electrodes. The process includes the first step of using a rough alignment between the plate to be inspected and the standard inspecting plate so that the two lie on top of each other. One of the plates is then rotated relative to the other by a predetermined small angle. The electrical connection state between the two plates is then determined. A mathematical analysis of the position deviation between the two plates takes place. The analysis is based on the relative positions of the electrode inspected and the corresponding inspecting electrode before and after the rotation.

5 Claims, 5 Drawing Sheets

PROCESS FOR INSPECTING ELECTRODES USING ROTATION ALIGNMENT CORRECTION

BACKGROUND OF THE INVENTION

This invention relates to a process for inspecting an electrode plate to be inspected (referred to hereinafter merely as an electrode plate), and more particularly to a process for inspecting the electrical connection state of electrodes of an electrode plate such as a printed wiring board having many electrodes or the like.

In general, many electrodes are formed on a printed circuit board, and in the case of such a printed wiring board, it is necessary to inspect whether the many electrodes are in the desired electrical connection state or in the desired insulation state in a stage before various functional parts are fabricated on the printed wiring board. For this inspection, it is necessary to achieve electric connection between an electrode plate such as a printed wiring board or the like and an inspection electrode plate having arranged thereon inspection electrodes corresponding to the electrodes to be inspected of the electrode plate by arranging the inspection electrode plate and the electrode plate so that the two lie one on the other.

For the above-mentioned purpose, an alignment between the electrode plate and the inspection electrode plate has heretofore been achieved by, for example, a means for fitting the alignment pins provided on the inspection electrode plate into the corresponding pin holes of the electrode plate, or other so-called mechanical alignment means.

In recent years, however, the parts packing density of printed wiring board has been increased and the density of pattern of printed wiring board has become higher. As a result, it is important to make the electrodes of the electrode plate smaller and the connection lines of the printed wiring board finer and arrange them in a higher density. However, when an alignment between such an electrode plate and an inspection electrode plate is only effected by a mechanical alignment means, merely a rough alignment state is obtained and it is impossible to sufficiently achieve the electrical connection of all inspection electrode pairs each consisting of an electrode to be inspected and an inspection electrode corresponding thereto.

The reasons therefor are that even when the electrodes to be inspected of the electrode plate and the inspection electrodes of the inspection electrode plate have basically the corresponding patterns, it follows that the electrodes to be inspected of the electrode plate are actually located in positions deviated, though slightly, from the design positions owing to a fine error caused in the production of the electrode plate or an error due to the deformation of the electrode plate per se. Also, there are similar situations in the inspection electrodes of the inspection electrode plate. Moreover, in the case of using alignment pins, a so-called play is required between the alignment pin and the corresponding pin hole and this becomes one of the causes of position deviation in the inspection electrode pair.

Under such circumstances, it is necessary to make a rough alignment between the electrode plate and the inspection electrode plate by, for example, a mechanical alignment means and then make a fine alignment to achieve precise position adjustment of the electrodes to be inspected of the electrode plate and the inspection electrodes of the inspection electrode plate.

For achieving such a fine alignment, a method has heretofore been known which comprises forming an appropriate alignment mark on an electrode plate in a specific position relation to the electrodes to be inspected; forming a control alignment mark on the inspection electrode plate in the same specific relation to the inspection electrodes as on the electrode plate; fixing the electrode plate onto a movable stage capable of moving in the lengthwise or crosswise direction or about the rotating axis; detecting the positions of the two alignment marks by an appropriate detection means; slightly moving the electrode plate relatively to the inspection electrode plate via the movable stage so as to remove the position deviation detected to thereby obtain a state in which the two alignment marks coincide in position with each other.

According to such a fine alignment means, however, it is impossible to completely remove the errors in position or shape of the alignment marks caused in the formation of the marks per se on the electrode plate and the inspection electrode plate, and errors appear to some extent in the detection of whether the two alignment marks coincide with each other. Therefore, a very complicated operation is required until the objective fine alignment has been sufficiently achieved, and even when a state in which the alignment marks coincide completely with each other has been obtained there is still a fear that there may be a case where the desired electrical connection state is not achieved in some actual inspection electrode pairs.

Also, in order to detect alignment marks on the electrode plate and the inspection electrode plate, it is necessary to provide, for example, an alignment mark-observing camera or other alignment mark detecting means. Moreover, such an alignment mark detecting means must be arranged above the alignment mark and in a direction vertical to the electrode plate, and, as a matter of course, the inspection electrode plate must be arranged so that the surface of the electrode plate is covered therewith. Hence, the alignment mark detecting means and the inspection electrode plate must be provided at the same place, which makes it very difficult to place them in adequate positions.

As described above, all of the conventional fine alignment methods aim at alignment between the electrodes of the electrode plate and the inspection electrodes of the inspection electrode plate; nevertheless it is not possible to exactly detect the position deviation state actually caused between the electrode plate and the inspection electrode plate because each of the methods uses an indirect deviation detecting means placed in a specific position relation to the electrode plate and the inspection electrode plate.

Also, as the result mentioned above, it is difficult to conduct an accurate fine alignment operation, and a long time and a complicated working are required until a state in which the position deviation has been removed and the desired alignment has been achieved is obtained. After all, it is impossible to achieve the desired inspection of an electrode plate with a high reliability in a high efficiency.

SUMMARY OF THE INVENTION

The object of this invention is to provide a process for inspecting an electrode plate with a high reliability in a very high efficiency, which makes it possible to exactly determine the state of the actual position deviation caused between the electrodes to be inspected of the electrode plate and the corresponding inspection electrodes of an inspection electrode plate, namely in the inspection electrode pairs, without using any special position deviation detecting means, and hence, makes it possible to easily achieve the desired fine alignment.

According to this invention, there is provided a process for inspecting an electrode plate having plural electrodes to be inspected, which comprises conducting a position deviation detecting operation comprising:

(1) an initial state detecting step of detecting the electrical connection states of inspection electrode pairs each consisting of an electrode to be inspected of an electrode plate and an inspection electrode of an inspection electrode plate having corresponding inspection electrodes in a state that a rough alignment has been made between the two plates which are arranged so that the two lie one on the other;

(2) a state-after-rotation detecting step of detecting the electrical connection state between the electrode to be inspected and the inspection electrode in said each inspection electrode pair after the electrode plate and the inspection electrode plate in the rough alignment state have been relatively rotated by a predetermined angle around a rotation axis vertical to both the electrode plate and the inspection electrode plate; and (3) an analyzing step of determining by a mathematical analysis means the state of the position deviation caused between the electrode plate and the inspection electrode plate in the rough alignment state based on (i) the position occupied by one of the electrode to be inspected and the inspection electrode constituting each of the plural inspection electrode pairs whose electrical connection states have been varied by at least the above rotation operation, on coordinates whose base position is the above-mentioned rotation axis, (ii) the contents of the electrical connection state of each of the inspection electrode pairs detected in the initial state detecting step (1) and the state-after-rotation detecting step (2) and (iii) the direction and degree (angle) of the rotation in the rotation operation in the state-after-rotation detecting step (2).

This invention also provides the above-mentioned inspection process, wherein the state-after-rotation inspecting step (2) is practiced several times varying the rotation angle and/or the position of rotation axis in the rotation operation and the analyzing step (3) for determining the state of relative position deviation between the electrode plate and the inspection electrode plate by a mathematical analysis means is practiced in the rough alignment state based on the results detected and conditions used in each of the initial state inspecting step (1) and the several state-after-rotation inspecting steps (2).

BRIEF DESCRIPTION OF THE DRAWINGS

In FIGS. 1 to 8, P, P1 and P2 refer to electrodes to be inspected; D, D1 and D2 to inspection electrodes; PB to an electrode plate; DB to an inspection electrode plate; DP1 and DP2 to inspection electrode pairs; 10 to an inspection apparatus body; 11 to a tester; 12 to a controlling computer, 13 to a position controlling computer; 14 to a control mechanism; 15 to a conveyance table, 17 to a camera for rough alignment; 18 to an electrode plate holder; 21 to an upper unit; 22 to a lower unit; 23 to an adapter board; 24 to an anisotropically conductive elastomer sheet; 24A to a projection; 25 to an upper base; 25A to a connection electrode; 26 to an adapter board; 27 to an anisotropically conductive elastomer sheet; 28 to a lower base; 29 to a pressurizing mechanism; 30 to a printed wiring board; 41 to an adapter board; 42 to a connecting elastomer layer; 43 to a connection electrode; 44 to a conductive area and 45 to a connection wiring.

DETAILED DESCRIPTION OF THE INVENTION

Figure 1:
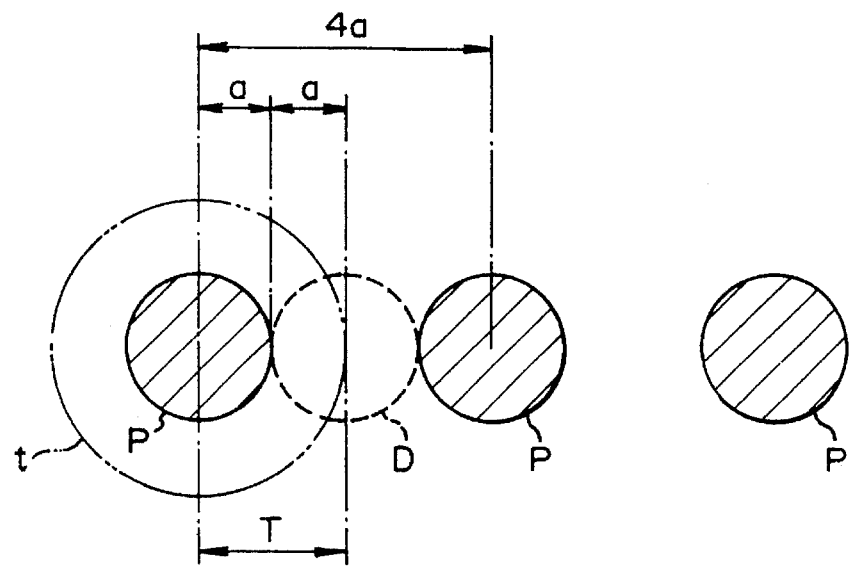
FIG. 1 is an explanatory view of the connection tolerance in an example of an electrode to be inspected.

In the process for inspecting an electrode plate of this invention, a rotation operation is applied to an electrode plate and an inspection electrode plate in a rough alignment state to rotate them by a relatively predetermined rotation angle ($\phi$) and an electrical connection state in an inspection electrode plate pair consisting of an electrode to be inspected of the electrode plate and the corresponding inspection electrode of the inspection electrode plate, namely whether or not the two are electrically conductive, is detected as to each of the state before the rotation operation (referred to hereinafter as the first state) and the state after the rotation operation (referred to hereinafter as the second state), to thereby obtain the information stated in (I) to (III) below:

(I) The position on the coordinates whose base position is the rotation axis of the inspection electrode pair whose electrical connection state has been varied by the rotation operation.

(II) The specific contents of the variation of the electrical connection state in the inspection electrode pair, namely whether the change is from conductive state to nonconductive state or from nonconductive state to conductive state.

(III) The degree (angle) and direction of rotation in the rotation operation.

By utilizing the information in (I) to (III) above as a factor, the state of the position deviation caused between the electrode plate and the inspection electrode plate in the first state can be determined by a mathematical analysis means based on the state of the displacement in each inspection electrode pair.

Accordingly, based on the state of position deviation determined above, the electrode plate and the inspection electrode plate are relatively moved by the necessary distance and/or the necessary angle for removing the position deviation, thereby easily and certainly achieving the desired fine alignment between the electrode plate and the inspection electrode plate.

The process of this invention is explained specifically below.

First of all, the basic, technical background of this invention is explained.

Usually, in the actual inspection of an electrode plate, there is a connection tolerance to some extent as to the electrical connection between an electrode to be inspected of the electrode plate and the corresponding inspection electrode of an inspection electrode plate, namely the electrical connection of the inspection electrode pair. That is to say, in the alignment between the electrode plate and the inspection electrode plate, it is not always necessary that the center of the inspection electrode constituting the inspection electrode pair coincide exactly with the center of the electrode to be inspected constituting the inspection electrode pair and there is a connectable range corresponding to the effective connection area of each of the electrode to be inspected and the inspection electrode. Even if the two centers do not coincide exactly with each other, when the position deviation is in the connectable range, the electrical conduction state is actually achieved, and hence, this is a sufficient alignment for the inspection.

The maximum of the connection tolerance may be varied depending upon the arrangement of electrodes to be inspected in the electrode plate, the dimension of each electrode to be inspected and other actual factors, and is determined in conformity with the actual requirements in relation to the inspection electrode plate.

This invention is explained below referring to the accompanying drawings. FIG. 1 is an explanatory view of the connection tolerance of an example of an electrode to be inspected in this invention. As shown in FIG. 1, when electrodes to be inspected P having a circular shape of a radius of a are arranged at a distance of $2a$ at an electrode pitch of $4a$, and when the inspection electrode D has the same radius a, the range in which the desired connection can be achieved is the area within a circle of a radius of $2a$ represented by t, and the connection tolerance T comes to have a size equal to $2a$. Accordingly, for example, when the electrode pitch is 0.3 mm and the width of each of the electrode to be inspected and the inspection electrode is 150 μm, usually, the connection tolerance becomes 150 μm.

However, even in the above example, the connection tolerance is not uniquely determined depending merely on the dimension and arrangement mode of the electrodes to be inspected, and there is a case where the connection tolerance is determined smaller so as to obtain a higher reliability considering further the maximum values of errors in the production of the electrodes to be inspected, the maximum values of errors in position of the inspection electrodes and other factors. Actually, the connection tolerance in an example of a certain printed wiring board is, for example, not more than 50 μm.

As can be understood from the above explanation, the state that a fine alignment has been achieved between the electrode plate and the inspection electrode plate means the state that all the electrodes to be inspected of the electrode plate are positioned within the connection tolerance to the corresponding inspection electrodes of the inspection electrode.

In this invention, the state of position deviation between the electrode plate and the inspection electrode plate in a rough alignment is determined by carrying out the initial state detecting step (1), the state-after-rotation detecting step (2) and the analyzing step (3) which are described below.

Initial State Detecting Step (1)

In the initial state detecting step (1), first of all, the electrode plate and the inspection electrode plate are roughly aligned. The means for this rough alignment is not critical, and, for example, a conventional alignment means can be used as it is. Specifically, there can be used a mechanical alignment means using alignment pins and corresponding pin holes; an optical alignment means using alignment marks; a try and error system alignment method by which the electrode plate and the inspection electrode plate are relatively moved to find the best position state; and other methods. Thus, the electrode plate and the inspection electrode plate come to be in the first state.

In the first state in which the electrode plate and the inspection electrode plate are merely roughly aligned, it is usual that a position deviation, though slight, appears between the electrode plate and the inspection electrode plate (said position deviation is referred to hereinafter as the initial position deviation), and in some of the many inspection electrode pairs, the position deviation is within the connection tolerance and said some inspection electrode pairs are in a conduction state, but in the other pairs, the position deviation is beyond the connection tolerance and hence the said inspection electrode pairs are in the non-conduction state.

Figure 2:
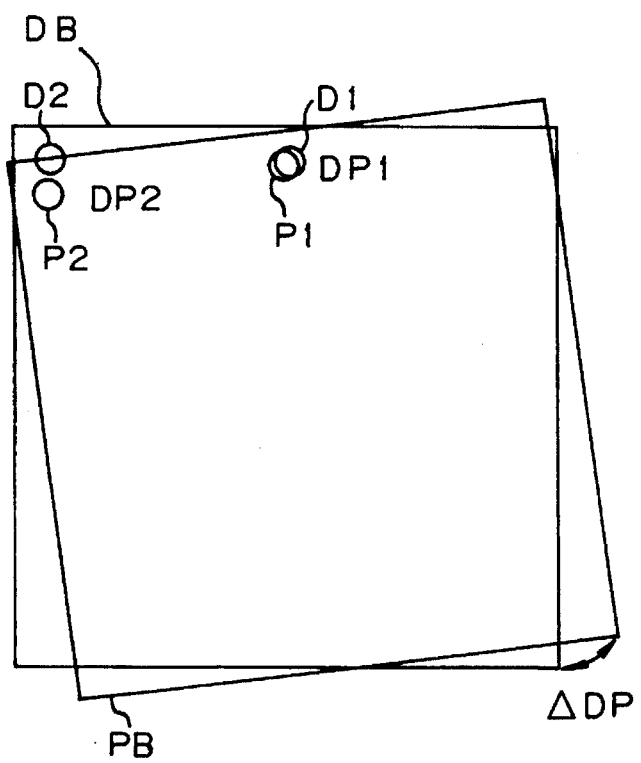
FIG. 2 is a diagrammatic view of the state that a rough alignment is made between an electrode plate and an inspection electrode plate in the initial state detecting step of the process of this invention.

FIG. 2 is a diagrammatic view of an example of the rough alignment state of an electrode plate and an inspection electrode plate. As shown in FIG. 2, in the first state, the initial position deviation ΔDP is caused between the electrode plate PB and the inspection electrode plate DB, whereby the electrode to be inspected P2 and the inspection electrode D2 which constitute the inspection electrode pair DP2 are in a non-conduction state though the electrode to be inspected P1 and the inspection electrode D1 which constitute the inspection electrode pair DP1 are in a conduction state.

In the first state, the first inspection of electrical connection state of all the inspection electrode pairs is carried out.

The degree of the above-mentioned initial position deviation is not more than a certain degree because the rough alignment has been made, and even in the case of the inspection electrode pair those position deviation degree is the greatest, the displacement Δdp concerning the said inspection electrode pair (namely, the displacement of the electrode to be inspected from the inspection electrode) is at maximum 70 μm. The initial position deviation ΔDP and the displacement Δdp concerning each inspection electrode pair are of course varied depending upon the means for alignment, and become, for example, at maximum about 100 μm in the case of using alignment pins.

State-after-rotation Detecting Step

Subsequently to the above-mentioned initial state detecting step, the state-after-rotation detecting step is carried out.

Figure 3:
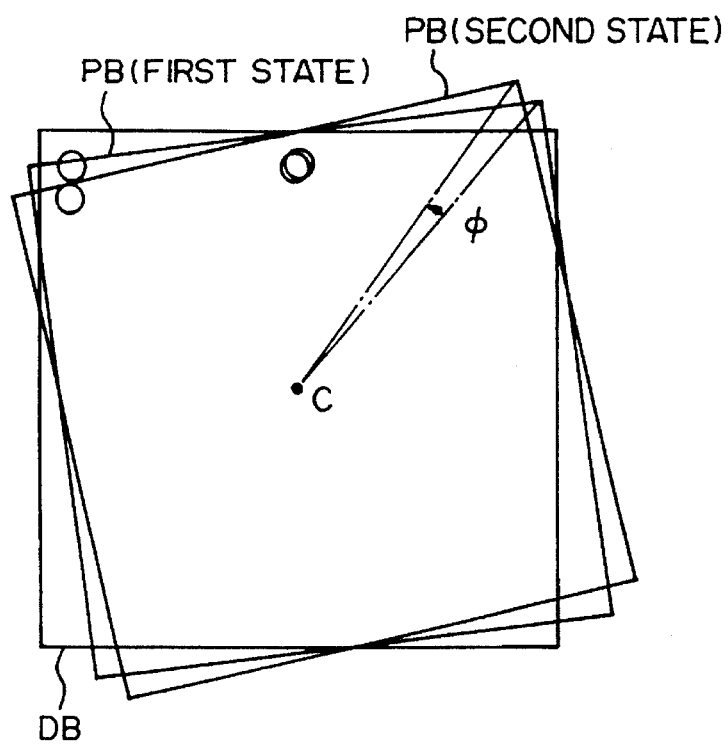
FIG. 3 is an explanatory view of the state that an electrode plate and an inspection electrode plate are rotated in the state-after-rotation detecting step of the process of this invention.

In the state-after-rotation detecting step, a rotation operation is conducted. For example, as shown in FIG. 3, the electrode plate PB is rotated in relation to the inspection electrode plate DB in the counterclockwise direction, for example, by a slight angle around the vertical rotation axis C defined at the center of the inspection electrode plate DB to become the second state.

This rotation operation can be effected by either rotating the inspection electrode plate DB in relation to the electrode plate PB instead of rotating the electrode plate in relation to the inspection electrode plate, or rotating both the electrode plate PB and the inspection electrode plate DB. This can be selected depending upon the specific construction of an actual inspection apparatus.

In the second state in which the rotation operation has been effected, the second inspection of the electrical connection state is conducted in quite the same manner as in the first inspection of the electrical connection state.

Analyzing Step

Based on the results of the first inspection of the electrical connection state obtained in the initial state detecting step, the results of the second inspection of the electrical connection state obtained in the state-after-rotation detecting step, the mode of the rotation operation effected before the second inspection of the electrical connection state, that is, the degree ($\phi$) and direction of rotation, the position deviation state caused between the electrode plate and the inspection electrode plate in the first state is calculated as follows by a mathematical analysis means with respect to each inspection electrode pair.

Figure 4:
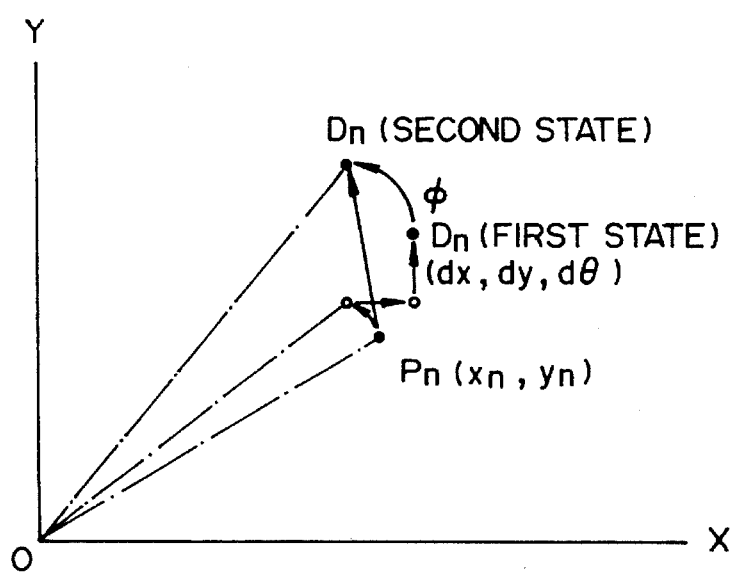
FIG. 4 is an explanatory view of the initial position deviation and displacement due to rotation with respect to an inspection electrode pair consisting of an electrode to be inspected and an inspection electrode in the process of this invention.

FIG. 4 is an explanatory view of the initial position deviation concerning an inspection electrode pair consisting of an electrode to be inspected and an inspection electrode and the displacement due to rotation concerning the pair.

In the model shown in FIG. 4, two-dimensional X-Y coordinate axes whose origin O is the rotation axis in the rotation operation are provided, and a case is shown where an inspection electrode $P_n$ whose coordinate position is indicated by $(x_n, y_n)$ is used as the base and the deviation of the coordinate position of an electrode to be inspected $D_n$ which constitutes, together with the inspection electrode $P_n$, an inspection electrode pair is (dx, dy, d$\theta$) as a result of the initial position deviation in the first state. That is to say, the inspection electrode $D_n$ exists in the position which is rotated by an angle d$\theta$ in the counterclockwise direction from the base position which is the coordinate position $(x_n, y_n)$ of the inspection electrode $P_n$ and further displaced by dx in the X direction and by dy in the Y direction.

In the case where the electrode to be inspected $D_n$ has been rotated by an angle $\phi$ in the rotation operation in the state-after-rotation detecting step, when the deviation of the coordinate position of the electrode to be inspected $D_n$ from the base position $(x_n, y_n)$ in the second state is indicated as $\Delta r_n$, the following equations (1) and (2) hold concerning the ith inspection electrode pair in respect of the said $\Delta r_n$:

$$\Delta x_i = dx - y_i(\phi + d\theta) \tag{1}$$

$$\Delta y_i = dy + x_i(\phi + d\theta) \tag{2}$$

wherein the rotation angle $\phi$ in the rotation operation is defined as equation (3) for the convenience of calculation:

$$\phi = \arctan(T/R) \tag{3}$$

wherein T is the connection tolerance and R is the average value of the distance from the origin O of the group of the electrodes to be inspected.

Under the above conditions, from the results of the first and second inspections of the electrical connection state, it can be regarded that the following equations (4) to (9) hold approximately for the electrodes to be inspected in the following cases (a) to (c):

(a) Such electrodes to be inspected that in the first state, the position deviation is within the connection tolerance, and in the second state, it is also within the connection tolerance $$\Sigma_i r \times (\phi/2)(-\sin\theta) = \Sigma_i \Delta x_i \tag{4}$$

$$\Sigma_i r \times (\phi/2)(\cos\theta) = \Sigma_i \Delta y_i \tag{5}$$

(b) Such electrodes to be inspected that in the first state, the position deviation is within the connection tolerance and in the second state, it is beyond the connection tolerance $$\Sigma_i (T + r_i \cdot \phi/2)(-\sin\theta) = \Sigma_i \Delta x_i \tag{6}$$

$$\Sigma_i (T + r_i \cdot \phi/2)(\cos\phi) = \Sigma_i \Delta y_i \tag{7}$$

(c) Such electrodes to be inspected that in the first state, the position deviation is beyond the connection tolerance and in the second state, it is within the connection tolerance $$\Sigma_i (T - r_i \cdot \phi/2)(-\sin\theta) = \Sigma_i \Delta x_i \tag{8}$$

$$\Sigma_i (T - r_i \cdot \phi/2)(\cos\theta) = \Sigma_i \Delta y_i \tag{9}$$

In the above cases (b) and (c), the electrical connection state of the electrode to be inspected has been changed, and hence, the quantity of the movement of the electrode to be inspected by the rotation operation is regarded as being on average equal to T in each of the cases (b) and (c).

Also, in the equation (3), the conditions under which the quantity of movement of 50% of the electrodes to be inspected by the rotation operation is within the connection tolerance and the quantity of movement of the remaining 50% by the rotation operation is beyond the connection tolerance are established by defining the connection tolerance as 50 μm.

Using the above equations (1) to (9), the numerical values of dx, dy and d$\theta$ most applicable to each equation can be determined about all the electrodes to be inspected $D_n$ by, for example, the method of least squares, so that the results obtained can be collectively treated about all the electrodes to be inspected to specifically determine the state of the initial position deviation of the electrode plate PB in relation to the inspection electrode plate DB.

In the above explanation, the results of all the electrodes to be inspected are taken into consideration; however, even when the information of the electrodes to be inspected whose electrical connection states have been varied by the rotation operation, namely the electrodes to be inspected in the above case (a), has been excluded and only the information of the electrodes to be inspected in the above cases (b) and (c) are taken in consideration, similarly applicable numerical values of dx, dy and d$\theta$ can be determined though the reliability is somewhat lowered.

In the above, an explanation is made of a case where an inspection electrode plate is the base and the position deviation of an electrode to be inspected which has been caused in relation to the inspection electrode of the inspection electrode pair, the other constituent of which is said electrode to be inspected, is inspected; however, quite the same inspection operation can be applied to a converse case where an electrode plate is the base and the position deviation of an inspection electrode which has been caused in relation to the electrode to be inspected of the inspection electrode pair, the other constituent of which is said inspection electrode, is inspected.

From the state of the initial position deviation determined as mentioned above, the electrode plate and the inspection electrode plate are relatively moved by the necessary quantity in the necessary direction for reducing the initial position deviation, whereby it is made possible to remove the initial position deviation and achieve fine alignment between the two. As a result thereof, an inspection can be carried out about the said electrode plate with a very high reliability.

As explained above, the basic principle of this invention can be said to be that when the electrode plate and the inspection electrode plate are relatively rotated, at least the inspection electrode pairs whose electrical connection states have been varied are analyzed for the state of the variation and the results obtained are integrated, whereby the direction of the initial position deviation can be determined depending upon whether the relative rotation of the electrode to be inspected and the inspection electrode by the rotation operation increases or inversely decreases the initial position deviation between the two and also that utilizing the fact that the quantity of movement of each inspection electrode pair by rotation is varied depending upon the distance of the pair from the rotation center, the state of the initial position deviation caused between an electrode plate and an inspection electrode plate can be determined by a mathematical analysis means with a sufficiently high precision, though approximately, based on the positions of the inspection electrode pair on the coordinates whose base position is the center of the rotation of the pair and the contents of the variation of the electrical connection state of the pair.

Accordingly, after the initial state inspecting step (1) has been carried out, the state-after-rotation detecting step (2) is firstly carried out as mentioned above, and further, the state-after-rotation detecting step (2) is secondly carried out by rotation operation of a different rotation angle and/or a different position of rotation axis from the rotation angle and/or position of rotation axis in the rotation operation in the first state-after-rotation detecting step, whereby information becomes obtained of plural state-after-rotation detecting steps by rotating at a different angle from that in the initial state. By carrying out a similar analysis step using the information, the state of the initial position deviation can be detected with a higher reliability.

Figure 5:
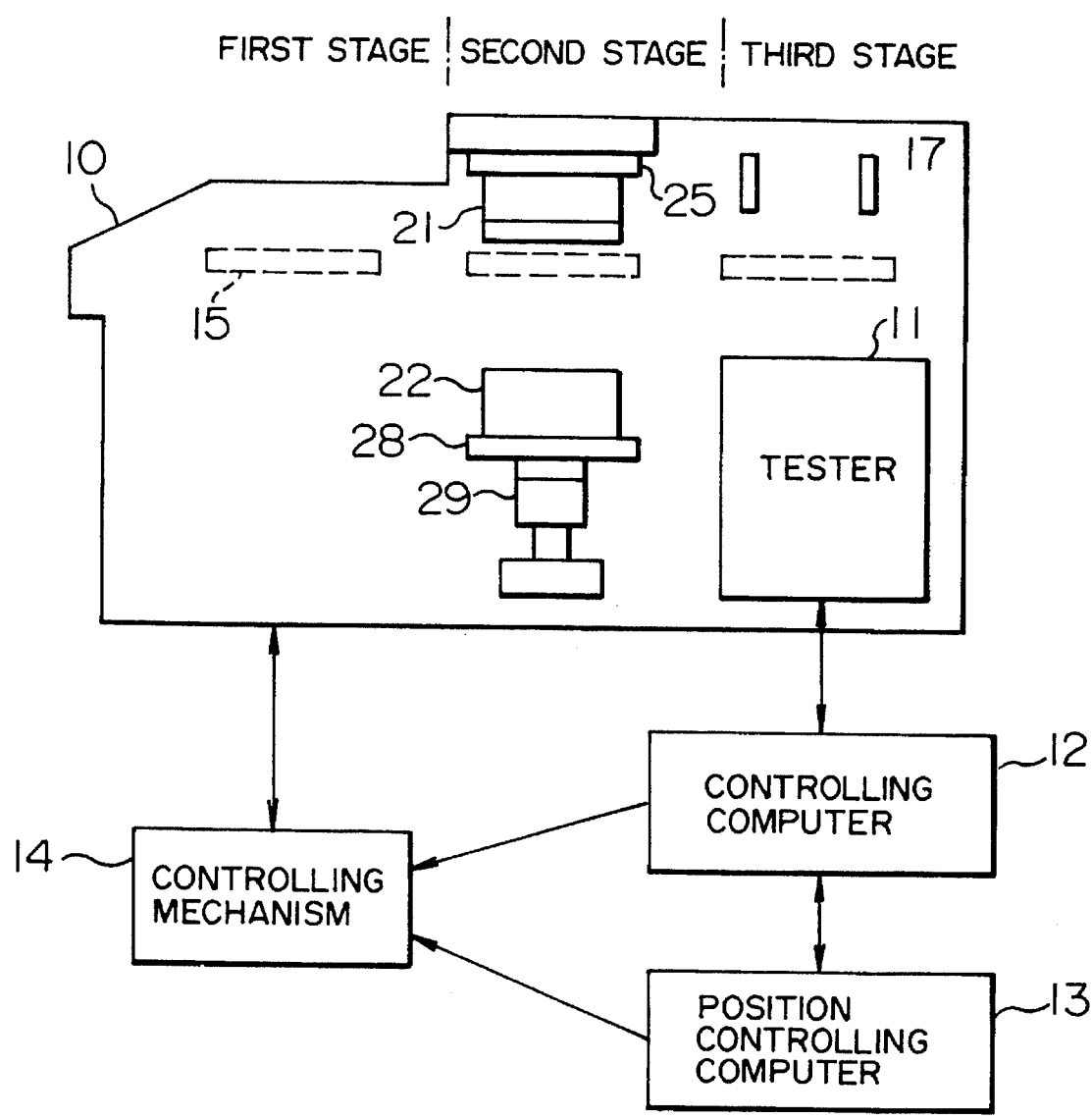
FIG. 5 is a block diagram showing a total system in an example of apparatus capable of being used in the practice of the present process for inspecting an electrode plate.

FIG. 5 is a block diagram of a total system in an example of apparatus capable of being used in carrying out the present process for inspecting an electrode plate, in which 10 refers to an inspection apparatus body, 11 to a tester having many switching boards (not shown) provided in the inspection apparatus body 10, 12 to a controlling computer for the tester 11, 13 to a position-controlling computer, and 14 to a controlling mechanism.

The inspection apparatus body 10 is divided into three sections of the first stage, the second stage and the third stage arranged in the horizontal direction, and a conveyance table 15 is provided so as to move among the stages. On this conveyance table 15, an electrode plate holder (not shown) for horizontally holding the electrode plate is provided so that the holder can move in the X direction, the Y direction and the rotation direction.

In the first stage, an electrode plate, for example, a printed wiring board, is mounted on the electrode plate holder on the conveyance table 15 and taken off therefrom. The second stage is the inspection stage, in which the electrical connection state between the electrode plate and the inspection electrode plate is inspected.

In the third stage, the electrode plate holder (not shown) is moved by the controlled quantity in the X direction, the Y direction and the rotation direction on the conveyance table 15, whereby the position of the electrode plate to the conveyance table 15 is adjusted so that when the conveyance table 15 reaches the second stage a state that a rough alignment between the electrode plate and the inspection electrode plate is achieved can be obtained. In this third stage, two camera systems 17 for rough alignment are arranged to watch the alignment mark formed on the electrode plate, thereby making the above-mentioned rough alignment.

Figure 6:
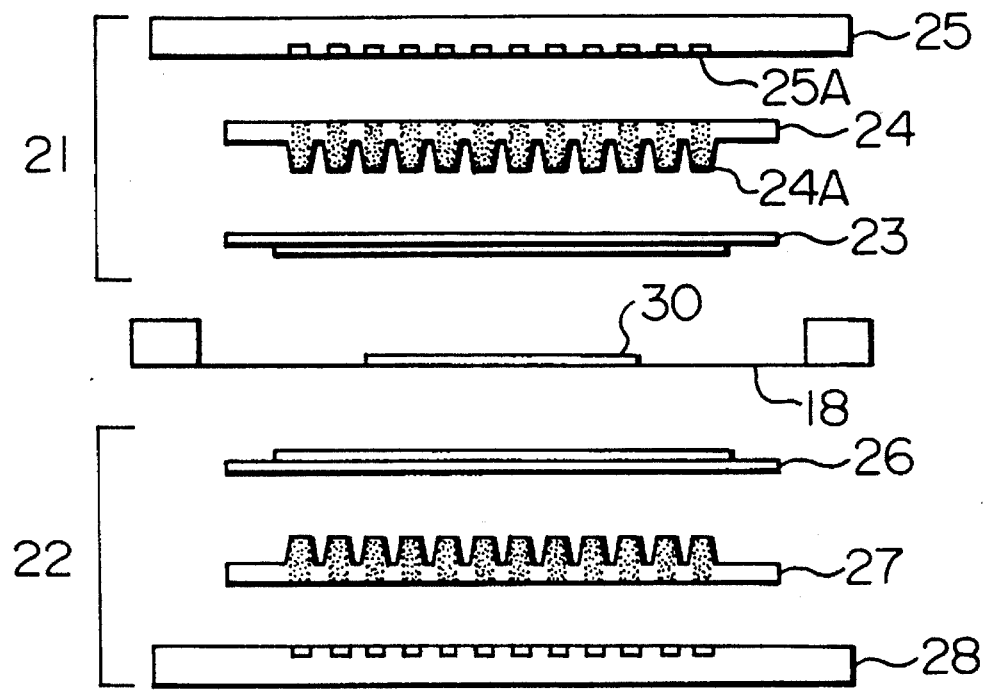
FIG. 6 is an explanatory view showing a specific construction of an inspection electrode plate device having an inspection electrode plate in the inspection stage in the example of FIG. 5.

FIG. 6 is an explanatory view showing a specific construction of an inspection electrode plate device having an inspection electrode plate to be used in the inspection stage which is the second stage. This inspection electrode plate device consists of an upper unit 21 and a lower unit 22, and the printed wiring board 30 held on the electrode plate holder 18 of the conveyance table 15 is arranged between the upper unit 21 and the lower unit 22.

The upper unit 21, which is on the upper side of the printed wiring board 30, is composed of an adapter board 23, an anisotropically conductive elastomer sheet 24 and an upper base 25 which are laminated to one another in this order from the lower side. The lower unit 22, which is on the lower side of the circuit board 30, is composed of an adapter board 26, an anisotropically conductive elastomer sheet 27 and a lower base 28 which are laminated to one another in this order from the upper side.

Figure 7:
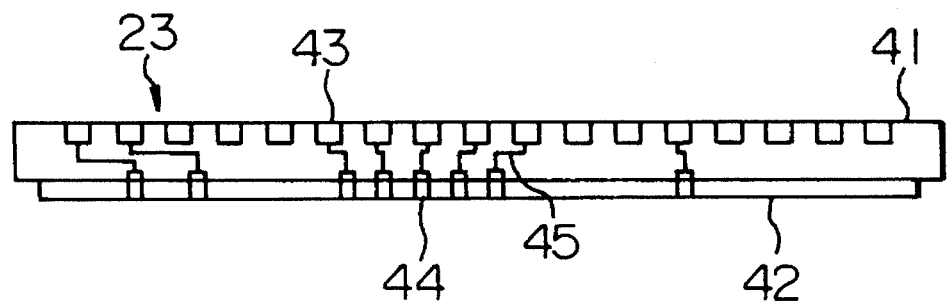
FIG. 7 is an explanatory cross-sectional view showing the construction of an adapter board in an upper unit in the example of FIG. 6.

In the adapter board 23 in the upper unit 21, a connecting elastomer layer 42 is integrally molded onto the lower side of an insulating board body 41 as shown in FIG. 7, and on the upper side of the board body 41, connection electrodes 43 are formed in an arrangement corresponding to the arrangement of the connection electrodes 25A on the upper base 25. In the connecting elastomer layer 42, conductive areas 44 which are insulated to one another are formed in an arrangement corresponding to the arrangement of the electrodes to be inspected placed on the upper side of the printed wiring board 30 which is an electrode plate. Each of the conductive areas 44 is electrically connected to any one of the connection electrodes 43 through an appropriate connecting wiring 45.

Also, the adapter board 26 in the lower unit 22 has quite the same construction as the adapter board 23 in the upper unit 21 in relation to the printed wiring board 30.

The conductive areas 44 in the connecting elastomer layer 42 formed on the above adapter board 23 act as inspection electrodes for the electrode to be inspected on the upper side of the printed wiring board 30, and the conductive areas 44 formed in such an elastomer layer can have a relatively large connection areas, and hence, there is an advantage that the connection tolerance becomes large in relation to the electrodes to be inspected.

As shown in FIG. 5, the upper base 25 in the upper unit 21 is fixed in the apparatus body, while the lower base 28 in the lower unit 22 is provided so as to be movable upward and downward on the upper side of the pressurizing mechanism 29 fixed in the apparatus body.

All the anisotropically conductive elastomer sheets 24 and 27 shown in the figure have a number of projections 24A throughout the surface of the elastic elastomer sheet, and in the interior of each of the projections, conductive particles consisting of a metal or the like are dispersed and when the sheet is compressed in the thickness direction, conductive paths in the thickness direction are formed by the above projections.

In the third stage in the apparatus having the above-mentioned construction, the alignment mark formed on the electrode plate of the printed wiring board 30 held on the electrode plate holder of the conveyance table 15 is watched by means of the camera 17 to make a rough alignment between the electrodes to be inspected and the conductive areas 44 which are the inspection electrodes on the adapter board 23, whereby when the conveyance table 15 is transferred to the second stage, the first state in which a rough alignment between the printed wiring board 30 which is the electrode plate and the adapter board 23 which is the inspection electrode plate has been completed is obtained.

In this first state, the first inspection of the electric connection is effected as follows: The lower unit 22 is moved upwardly by the pressurizing mechanism 29 to press the circuit board 30 between the lower unit 22 and the upper unit 21, whereby the upper surface of the printed wiring board 30 is pressed to the connecting elastomer layer 42 of the adapter board 23. And all the electrodes to be inspected on the upper surface of the printed wiring board 30 within the connection tolerance are pressed to the conductive areas 44, which are inspection electrodes, in the connecting elastomer layer 42 and kept in a state of electrical conduction to the conductive areas 44. In this state, the electrical connection states of all the inspection electrode pairs are memorized into the controlling computer 12.

Subsequently, the printed wiring board 30 and the adapter board 23 are relatively rotated to be kept in the second state. Specifically, this rotation operation is conducted by moving the electrode plate holder in relation to the conveyance table 15, and the position of the rotation axis, the direction of rotation and the rotation degree (angle) in the said rotation operation are memorized into the position controlling computer 13.

Also, in this second state, the second inspection of electrical connection is effected, and the results of the second inspection of electrical connection obtained are similarly memorized into the position controlling computer 13.

In the position controlling computer 13, according to, for example, the above-mentioned example, the necessary calculation by a mathematical analysis means is made to determine the state of the initial position deviation existing between the printed wiring board 30 and the adapter board 23 in the first state. Thereafter, a fine alignment is made to remove the initial position deviation, and as a result, the state that all the electrodes to be inspected are electrically conductive to the corresponding inspection electrodes is obtained. In this state, the desired inspection is carried out on the said electrode plate.

In the example shown in the figure, the printed wiring board 30 has electrodes on both upper and lower sides; however, when the arrangement of the connection electrodes in the adapter board 26 of the lower unit 22 coincide completely with the connection electrodes 43 in the adapter board 23 of the upper unit 21 in the direction of from upper to lower, the alignment of the electrodes on both surfaces of the printed wiring board 30 in relation to the adapter boards 23 and 26 of the upper and lower units 21 and 22 can be achieved at one time by moving only the printed wiring board 30.

In the state-after-rotation detecting step of this invention, the rotation axis in the rotation operation may theoretically be in any position.

However, when the position of the rotation axis is set at the center of the area in which the inspection electrode pairs are arranged, it becomes necessary in some cases to make the absolute value of the rotation angle $\phi$ considerably large because when the rotation angle is smaller the proportion of the inspection electrode pairs whose electrical connection state is varied by the rotation becomes low.

On the other hand, when the position of the rotation axis is set in a position far from the area in which the inspection electrode pairs are arranged, the displacements given many inspection electrode pairs by the rotation become substantially the same displacements as in the case of parallel movement, and the difference of displacements resulting from the difference in position of the inspection electrode pairs becomes small. Therefore, when an analysis based on rotation is made, the difficulty of inspecting the state of the initial position deviation with a sufficiently high reliability increases.

The rotation angle $\phi$ in the rotation operation may be any angle theoretically; however, in order to make possible the reasonable mathematical analysis of the results to obtain the state of the initial position deviation as a specific displacement, it is convenient that as in, for example, the above-mentioned equation (3), the rotation angle is such as defined so as to include the connection tolerance as a factor. If a sufficient mathematical analysis is theoretically possible, the rotation angle may be an angle based on other definition as a matter of course.

In fact, the rotation angle is preferably, for example, in the range of 0.01° to 1.0°.

For carrying out the process of this invention, the information of wiring of the electrodes to be inspected on an electrode plate, that is, the information of electrical connection and isolation between the electrodes to be inspected is necessary.

When the initial position deviation to be detected by the process of this invention is too large, the result of inspection obtained does not become so high in reliability. Accordingly, the rough alignment is required in the initial state detecting step, and its degree is, for example, within about two times the connection tolerance.

For carrying out the analysis step of this invention, it is necessary to have information of the positions in which all electrodes to be inspected of an electrode plate should be, that is, information of positions of all the electrodes to be inspected on the coordinates.

The process for inspecting an electrode plate of this invention requires as stated above that the initial state detecting step, the state-after-rotation detecting step and the analyzing step are conducted, and the rough alignment in the initial state detecting step is a work essential to all inspections as mentioned above. The calculation in the analyzing step can be actually practiced in a very short period of time by utilizing a computer.

In addition, the inspection of the electrical connection state and the rotation operation can be sufficiently achieved in a short time. Therefore, in this invention, it follows that the state of initial position deviation can be inspected in a very short time as a whole.

According to this invention, the state of the initial position deviation detected can be determined as a specific displacement between the electrode plate and the inspection electrode plate. Accordingly, based on this result, it is possible to immediately practice the fine alignment of the two and surely achieve the objective alignment.

In addition, in this invention, alignment marks and other indirect alignment means are not used, and hence, there is no fear that errors may be unavoidably introduced by the alignment means per se. Moreover, the state of the initial position deviation is determined based on the displacement between the electrodes to be inspected of an electrode plate whose alignment should be made and the inspection electrodes of an inspection electrode plate. Therefore, a very high reliability is obtained.

Thus, the detection of the initial position deviation according to this invention can be practiced prior to the inspection of electrical connection state every inspection of each electrode plate which is repeatedly conducted. In addition, even in this case, the degree of prolongation of the inspection time required for each electrode plate is very slight.

EXAMPLE 1

This example is a simulation for confirming the effect of this invention.

Figure 8:
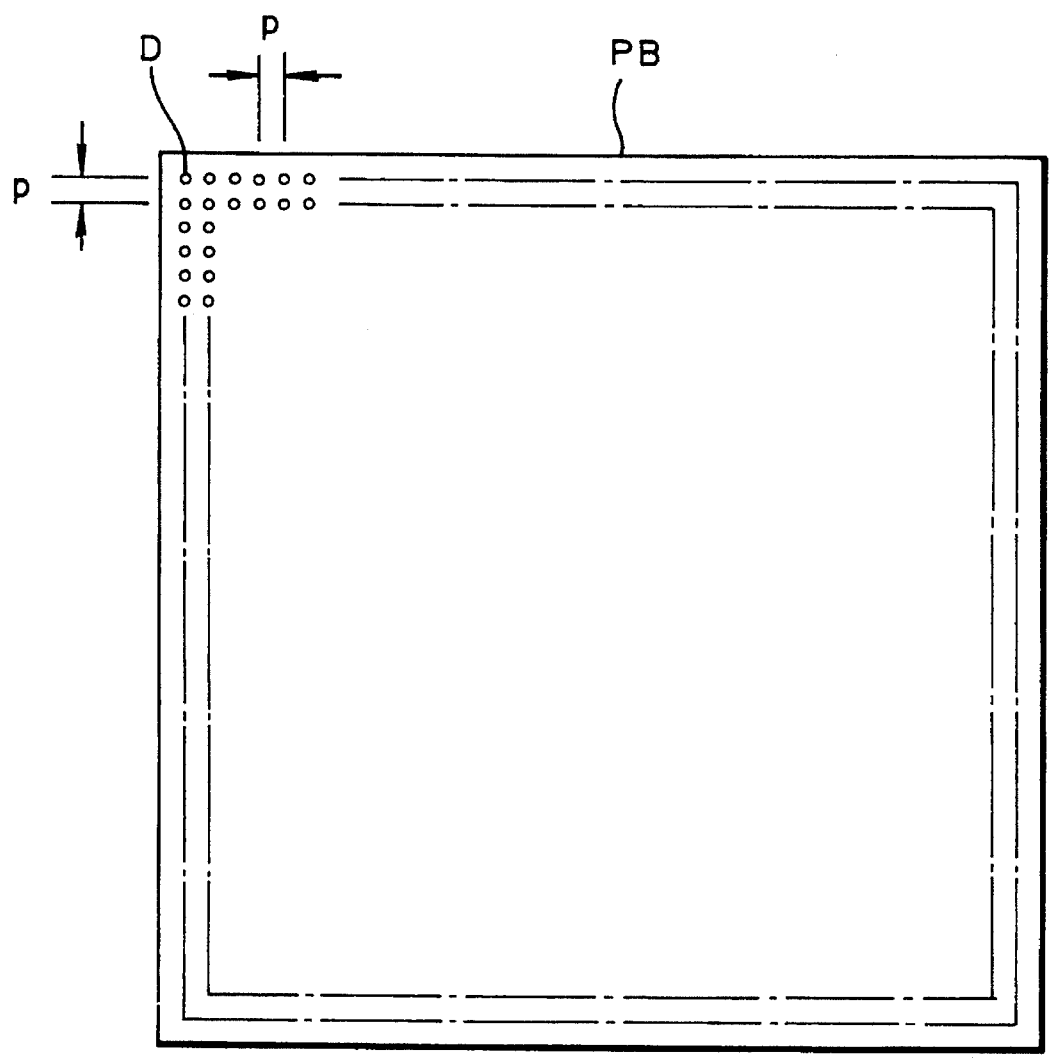
FIG. 8 is an explanatory view showing the arrangement of electrodes of a printed wiring board used in the simulation of this invention.

In this simulation, as shown in FIG. 8, there was used an electrode plate PB having a shape of a square having a side of 9 mm, along each side of which a total of 170 circular electrodes to be inspected D each having a diameter of 50 μm are arranged at a pitch p of 0.3 mm in a double line, and there was also used an inspection electrode plate having an electrode arrangement corresponding to that of the electrodes to be inspected D of the electrode plate PB. In the analyzing step, a treatment was conducted according to the above-mentioned equations (1) to (9). In this case, the connection tolerance [T in the above equation (3)] was 50 μm.

Table 1 shows the results obtained by intentionally rotating the electrode plate by −0.2° (dθ=−0.2°) from the state in which the electrode plate coincided completely with the inspection electrode plate with fixing the inspection electrode plate, and further slightly displacing the electrode plate by a varying dx and by varying dy to realize the state in which the initial position deviation was caused, and calculating the displacement (ΔD) of each of 170 inspection electrode pairs to determine the displacement of the inspection electrode pair showing the maximum displacement.

In this case, the displacement (ΔD) is a distance in a straight line between the inspection electrode and the electrode to be inspected of the inspection electrode pair. Also, as each of dx and dy, a total of 11 values of every 20 μm from −100 μm to +100 μm inclusive were selected.

Table 2 shows the results of the fine alignments practiced on every condition shown in Table 1. The numbers mean the maximum values of the displacements of the electrodes to be inspected determined in the same manner as in the case of Table 1. Where the rotation axis was the center of the electrode plate PB, the rotation angle φ was 0.589°.

In Table 2, therefore, the numbers of dx and dy do not mean the actual position of electrode plate in any way. They show the position of the electrode plate PB before the fine alignment and become a kind of index to compare with Table 1.

TABLE 1

(μm)

| dy \ dx → | −100 | −80 | −60 | −40 | −20 | 0 | 20 | 40 | 60 | 80 | 100 |
|---|---|---|---|---|---|---|---|---|---|---|---|
| 100 | 162 | 148 | 137 | 127 | 120 | 116 | 120 | 128 | 138 | 150 | 164 |
| 80 | 148 | 134 | 120 | 109 | 101 | 96 | 101 | 110 | 122 | 135 | 150 |
| 60 | 137 | 120 | 105 | 92 | 82 | 76 | 83 | 94 | 107 | 122 | 139 |
| 40 | 127 | 109 | 92 | 77 | 64 | 57 | 66 | 79 | 94 | 111 | 129 |
| 20 | 120 | 101 | 82 | 64 | 49 | 38 | 51 | 67 | 84 | 103 | 122 |
| 0 | 116 | 96 | 76 | 57 | 38 | 24 | 41 | 59 | 79 | 98 | 118 |
| −20 | 120 | 101 | 83 | 66 | 51 | 41 | 52 | 68 | 85 | 104 | 123 |
| −40 | 128 | 110 | 94 | 79 | 67 | 59 | 68 | 81 | 96 | 112 | 130 |
| −60 | 138 | 122 | 107 | 94 | 84 | 79 | 85 | 96 | 109 | 124 | 140 |
| −80 | 150 | 135 | 122 | 111 | 103 | 98 | 104 | 112 | 124 | 137 | 152 |
| −100 | 164 | 150 | 139 | 129 | 122 | 118 | 123 | 130 | 140 | 152 | 165 |

TABLE 2

(μm)

| dy \ dx | –100 | –80 | –60 | –40 | –20 | 0 | 20 | 40 | 60 | 80 | 100 |
|---|---|---|---|---|---|---|---|---|---|---|---|
| 100 | X | X | X | X | X | X | X | X | X | X | X |
| 80 | X | X | X | X | X | X | X | X | X | X | X |
| 60 | X | X | 134 | 50 | 32 | 30 | 33 | 127 | 125 | X | X |
| 40 | X | X | 52 | 26 | 16 | 13 | 16 | 25 | 136 | 110 | X |
| 20 | X | X | 33 | 15 | 32 | 17 | 30 | 13 | 34 | 125 | X |
| 0 | X | X | 30 | 13 | 17 | 11 | 15 | 12 | 29 | 135 | X |
| –20 | X | X | 33 | 16 | 30 | 15 | 18 | 17 | 35 | 115 | X |
| –40 | X | X | 127 | 25 | 13 | 12 | 16 | <u>24</u> | 128 | 112 | X |
| –60 | X | X | 129 | 138 | 34 | 29 | 34 | 128 | 129 | X | X |
| –80 | X | X | X | 110 | 126 | 135 | 115 | 114 | X | X | X |
| –100 | X | X | X | X | X | X | X | X | X | X | X |

In Tables 1 and 2, the area in which the values framed in a thick solid line are 50 μm or less means that the degree of position deviation of all inspection electrode pairs is within the connection tolerance and the electric conduction state is assured.

Also, in Table 2, "X" indicates the area in which the analysis by the above-mentioned mathematical analysis means was impossible.

From Table 1, it is understood that the area in which the deviation is within the connection tolerance of 50 μm or less is a range that dx is –20 μm to +20 μm and dy is –20 μm to +20 μm, and even in this range, the deviation is beyond the connection tolerance in some cases.

On the other hand, from Table 2, it is understood that the area in which there is a possibility of the deviation being within the connection tolerance is a range that dx is –60 μm to +60 μm and dy is –60 μm to +60 μm and also understood that in the range that dx is –40 μm to +40 μm and dy is –40 μm to +20 μm, the degree of position deviation is surely within the connection tolerance.

For example, in Table 1, it is seen that where dx=40 μm and dy=–40 μm, among 170 inspection electrode pairs, the degree of the position deviation of the inspection electrode pair whose position deviation degree is the maximum is 81 μm.

Accordingly, when a fine alignment was applied to the state in which the initial position deviation shown in Table 1 was caused, based on the state of the position deviation detected according to the process of this invention, the maximum value of position deviation became 24 μm as shown in Table 2 and was within the connection tolerance. Accordingly, it can be seen that the objective inspection is possible.

Tables 3 and 4 show the results of a simulation conducted in the same manner as in Tables 1 and 2, except that dθ was changed to +0.2°, the position of the rotation axis was changed to the corner of the electrode plate, and the rotation angle φ was changed to 0.394°.

From Tables 3 and 4, too, it can be understood that similarly to Tables 1 and 2, the desired alignment state is surely obtained with a high precision by practicing the fine alignment based on the results of detection of the initial position deviation according to the process of this invention.

TABLE 3

(μm)

| dx→ ↓dy | –100 | –80 | –60 | –40 | –20 | 0 | 20 | 40 | 60 | 80 | 100 |
|---|---|---|---|---|---|---|---|---|---|---|---|
| 100 | 188 | 174 | 162 | 151 | 143 | 137 | 134 | 138 | 145 | 154 | 165 |
| 80 | 174 | 159 | 146 | 134 | 124 | 117 | 114 | 119 | 127 | 137 | 150 |
| 60 | 162 | 146 | 131 | 118 | 107 | 98 | 95 | 100 | 110 | 122 | 135 |
| 40 | 151 | 134 | 118 | 103 | 90 | 80 | 75 | 82 | 93 | 107 | 123 |
| 20 | 143 | 124 | 107 | 90 | 74 | 62 | 56 | 65 | 79 | 95 | 112 |
| 0 | 137 | 117 | 98 | 80 | 62 | 46 | 38 | 51 | 67 | 85 | 104 |
| –20 | 134 | 114 | 95 | 75 | 56 | 38 | 27 | 43 | 62 | 81 | 101 |
| –40 | 138 | 119 | 100 | 82 | 65 | 51 | 43 | 55 | 70 | 88 | 106 |
| –60 | 145 | 127 | 110 | 93 | 79 | 67 | 62 | 70 | 83 | 98 | 115 |
| –80 | 154 | 137 | 122 | 107 | 95 | 85 | 81 | 88 | 98 | 111 | 126 |
| –100 | 165 | 150 | 135 | 123 | 112 | 104 | 101 | 106 | 115 | 126 | 140 |

TABLE 4

| dx→<br>↓dy | -100 | -80 | -60 | -40 | -20 | 0 | 20 | 40 | 60 | 80 | (μm)<br>100 |
|---|---|---|---|---|---|---|---|---|---|---|---|
| 100 | X | X | X | X | X | X | X | X | X | X | X |
| 80 | X | X | X | X | X | X | X | X | X | X | X |
| 60 | X | X | X | X | X | X | X | X | X | X | X |
| 40 | X | X | X | X | 208 | 35 | 57 | 60 | 55 | 115 | 122 |
| 20 | X | X | X | 209 | 25 | 24 | 32 | 48 | 40 | 100 | 113 |
| 0 | X | X | X | 35 | 24 | 25 | 23 | 38 | 31 | 16 | 106 |
| -20 | X | X | X | 55 | 32 | 23 | 21 | 37 | 27 | 9 | 102 |
| -40 | X | X | X | 62 | 48 | 38 | 37 | 39 | 30 | 35 | 99 |
| -60 | X | X | X | 56 | 40 | 31 | 27 | 30 | 63 | 90 | 104 |
| -80 | X | X | X | 116 | 100 | 19 | 9 | 37 | 90 | 103 | 117 |
| -100 | X | X | X | 124 | 113 | 106 | 103 | 100 | 104 | 117 | 130 |

EXAMPLE 2

In this example, an electrode plate having the same construction as in Example 1 was used and the following operation was conducted under the conditions that the connection tolerance was 40 μm:

The electrode plate was moved by slight distances in relation to an inspection electrode plate to repeat the inspection of electrical connection state, and the state of the position of the electrode plate in which the most stable inspection was practiced was determined and this was decided to be the objective position state.

Subsequently, the electrode plate was moved by dx, dy and dθ as shown in Table 5. The state obtained here was a state which could be regarded as being the first state in which a rough alignment was made, and in this state, the first inspection of electrical connection was practiced.

The displacement of each inspection electrode pair caused in the first state was calculated to determine the displacement of the inspection electrode pair whose displacement was the maximum. This is the "displacement before alignment" in Table 5.

Subsequently, the electrode plate was rotated by an angle φ from the first state. The rotation angle φ here was 0.392°, and the position of the rotation axis was the center of one side of the square. In this state, the second inspection of electrical connection was practiced.

Based on the results of the first and second inspections of electrical connection thus obtained, the arrangement of the electrodes to be inspected of the electrode plate used, specifically the information of bad connection obtained from the inspection apparatus and the design data of the electrode plate, the degree of position deviation of the electrode plate was calculated from the equations (1) to (9) to determine the state of the initial position deviation.

Based on the state of the initial position deviation detected here, a fine alignment was made, and thereafter, the displacement of each of the inspection electrode pairs was calculated to determine the maximum value as the "displacement after alignment".

The results are shown in Table 5.

TABLE 5

| Displacement before alignment | | | | Displacement after alignment | Conditions of rotation φ | |
|---|---|---|---|---|---|---|
| dx (μm) | dy (μm) | dθ (rad) | Degree (μm) | Degree (μm) | Position of rotation axis | Rotation degree (rad) |
| -15 | 30 | -0.150 | 68 | 29 | Center of one side of square | 0.392 |
| 15 | 15 | -0.150 | 54 | 24 | Same as above | 0.392 |
| 30 | 0 | -0.300 | 68 | 26 | Same as above | 0.392 |

From Table 5, it is understood that the state after the fine alignment was made was such that the displacement was within the connection tolerance 40 μm and a good conduction state was achieved in all the inspection electrode pairs.

In this invention, the inspection apparatus is not critical and may be any inspection apparatus in which the electrode plate and the inspection electrode plate can be relatively rotated.

According to the process for inspecting an electrode plate of this invention, the state of the initial position deviation caused between the electrode plate and the inspection electrode plate when a rough alignment is made can be detected by a very simple operation based on the displacement between the electrodes to be inspected of the electrode plate which is the direct object and the inspection electrodes of the inspection electrode plate, with a high reliability, and in addition, the time required therefor is very short. The state of the initial position deviation is obtained as a specific displacement between the electrode plate and the inspection electrode plate, and based thereon, a fine alignment is immediately practiced to achieve precisely the objective alignment. After all, the desired inspection of the electrode plate can be achieved in a high efficiency.

Also, where after the initial state detecting step has been practiced, the state-after-rotation detecting step is carried out several times, the state of the initial position deviation can be detected with a higher reliability.

What is claimed is:

1. A process for inspecting an electrode plate to be inspected having plural electrodes to be inspected, which comprises conducting a position deviation detecting operation comprising:

(1) an initial state detecting step of detecting the electrical connection states of inspection electrode pairs each consisting of an electrode to be inspected of the electrode plate to be inspected and an inspection electrode of an inspection electrode plate having corresponding inspection electrodes in the state that a rough alignment has been made between the two plates which are arranged so that the two lie one on the other;

(2) a state-after-rotation detecting step of detecting the electrical connection state between the electrode to be inspected and the inspection electrode in said each inspection electrode pair after the electrode plate to be inspected and the inspection electrode plate in the rough alignment state have been relatively rotated by a predetermined angle around a rotation axis vertical to both the electrode plate to be inspected and the inspection electrode plate; and (3) an analyzing step of determining by a mathematical analysis means the state of the position deviation caused between the electrode plate to be inspected and the inspection electrode plate in the rough alignment state based on (i) the position occupied by any one of the electrodes to be inspected and the inspection electrode constituting each of the plural inspection electrode pairs whose electrical connection states have been varied by at least the above rotation operation, on coordinates whose base position is the above-mentioned rotation axis, (ii) the contents of the electrical connection state of each of the inspection electrode pairs detected in the initial state detecting step (1) and the state-after-rotation detecting step (2) and (iii) the direction and angle of the rotation in the rotation operation in the state-after-rotation detecting step (2).

2. The inspection process according to claim 1, wherein the state-after-rotation detecting step (2) is practiced several times varying the rotation angle and/or position of rotation axis, and the analyzing step (3) for determining the state of relative position deviation between the electrode plate to be inspected and the inspection electrode in the rough alignment state by a mathematical analysis means is practiced based on the results detected and conditions used in each of the initial state detecting step (1) and the several state-after-rotation detecting steps (2).

3. The inspection process according to claim 1, wherein the connection tolerance of each of the inspection electrode pairs is 50 µm or less.

4. The inspection process according to claim 1, wherein the rotation angle in the rotation operation is in the range of 0.01° to 1.0°.

5. The inspection process according to claim 1, wherein the rough alignment in the initial state detecting step (1) is made so that the displacement falls within two times the connection tolerance of the inspection electrode pair.

* * * * *